United States Patent [19]

Taylor

[11] Patent Number: 4,767,946
[45] Date of Patent: Aug. 30, 1988

[54] HIGH-SPEED SUPPLY INDEPENDENT LEVEL SHIFTER

[75] Inventor: Stewart S. Taylor, Beaverton, Oreg.

[73] Assignee: Tektronix, Inc., Beaverton, Oreg.

[21] Appl. No.: 2,082

[22] Filed: Jan. 12, 1987

[51] Int. Cl.$^4$ .......................... H03K 5/02; H03K 5/08
[52] U.S. Cl. .............................. 307/264; 307/296 R; 307/491; 330/258; 330/277; 330/310; 330/296
[58] Field of Search ................... 307/264, 296 R, 297, 307/491, 501; 330/258, 277, 310, 296

[56] References Cited

U.S. PATENT DOCUMENTS

| | | | |
|---|---|---|---|
| 4,456,838 | 1/1984 | Taguchi et al. | 307/264 |
| 4,578,602 | 3/1986 | West et al. | 307/264 |
| 4,644,194 | 2/1987 | Birrittella et al. | 307/264 |

*Primary Examiner*—John Zazworsky
*Attorney, Agent, or Firm*—William S. Lovell; Alexander C. Johnson, Jr.

[57] ABSTRACT

A high-speed, supply independent level shifter is implemented in bipolar, JFET, MOSFET or MESFET integrated circuit technology. A level shift circuit having a desired input potential $V_1$ and a required output potential $V_2$, is incorporated into a first current leg connected between first and second supply voltages. A second current leg in parallel with the first leg establishes a reference current. The two current legs are coupled by a current mirror to establish a fixed, preferably equal, relationship between the currents in the two legs. Each current leg includes a reference resistor. A buffered, floating voltage source is coupled in series with the resistor in the first leg to the control conductor of the current mirror. The voltage source is designed and the resistor values selected to provide a potential $V_3$ that is an additive function of potentials $V_1$ and $V_2$ such that $V_1$ is independent of the supply voltages.

16 Claims, 3 Drawing Sheets

HIGH-SPEED SUPPLY INDEPENDENT LEVEL SHIFTER

BACKGROUND OF THE INVENTION

This invention relates generally to level shifting circuitry and more particularly to the problems of level shifting in high-speed operational amplifiers and other feedback amplifiers, particularly as incorporated into analog integrated circuits.

Level shifting is a general requirement in feedback amplifiers with large common mode input ranges and large output voltage swings. FIG. 1 illustrates, in block diagram form, a typical operational amplifier or feedback amplifier. A desired differential signal $V_{id}$ and a common mode signal $V_{icm}$ are applied to an input stage. The input stage is conventionally biased relative to a supply voltage or other reference voltage $V_{ref2}$ by appropriate bias circuitry, such as a current source. The potential V across the input stage must be maintained so as to meet the minimum voltage requirements for the input stage to operate.

The differential outputs of the input stage are connected to load circuits and input to a second stage, such as a level shifter. The load circuits are biased at a potential relative to another supply voltage or other voltage reference, $V_{ref1}$. The potential across the load circuits, $V_1$, is determined by the designer to meet the requirements for proper operation of the load circuits and the second stage. The level shifter has an output which must be at a sufficient potential, $V_2$, relative to voltage reference $V_{ref2}$ to interface to a third stage circuit (not shown). Thus, the level shifter should provide or absorb a voltage drop so as to produce the desired input potential $V_1$ given the output potential $V_2$. If both polarity-type devices are available in a given technology, a level shifter can be implemented as a common-emitter (source) stage, or as a common base (gate) stage of a polarity type opposite that of the input stage. In this case, the collector-emitter (drain-source) absorbs the difference in potential between the input and output of the level shifter. In a single polarity technology, or in a technology where only one polarity device is of high bandwidth, an alternative means is necessary to drop the required voltage.

These factors present difficult constraints within which the designer must design the level shifter. In addition, it is desirable for the common mode range to be as close as possible to the power supply voltages. Also, the supply voltages are subject to variations, for example, by design or due to temperature variations. Accordingly, designers conventionally choose a potential $V_1$ that is large enough to compensate for the expected range of such variations. Doing so, however, reduces common mode range and may require tradeoffs with respect to output voltage swing.

Single polarity prior art circuits result in non-optimum values of potential $V_1$ that do not adapt to power supply, process and temperature variations in a desirable way. Also, prior art implementations of level shifters typically incorporate components and combinations of components that are non-optimal, particularly for high-speed performance. One such implementation includes the use of lateral PNP transistors, which are too slow for wideband applications. An alternative implementation could use avertical PNP transistors if the fabrication process being used allows for it. This fabrication process is expensive, requiring extra processing and probably resulting in lower yields than less complex technologies. Vertical PNP transistors, in any event, are generally of lower bandwidth than NPN transisters. In many fabrication technologies, vertical PNP transistors or p-channel FETs are not available at all. Some prior art level shifters employ Zener diodes but these are noisy, unsuitable for a wide range of power supply voltages, and have a limited common mode range.

Accordingly, a need remains for a level shifter design that is capable of high-speed operation (at frequencies in excess of 1 GHz), is capable of adjusting in operation to supply, process (i.e., transistor parameters) and temperature variations, is capable of being implemented with a single polarity device, and frees the circuit designer from such tight design constraints.

SUMMARY OF THE INVENTION

One object of the invention is to provide an improved level shifter.

A second object of the invention is to facilitate high-speed or wideband level shifting.

Another object of the invention is to adapt operation of a level shifting circuit to supply, process and temperature variations.

Still another object of the invention is to implement a level shifter in a single polarity technology, such as NPN bipolar or N-channel JFET, MOSFET or GaAsFET.

A further object of the invention, as aforementioned, is to enable the designer to choose a potential $V_1$ between a first reference voltage and the input of the level shifter that is no larger than necessary in order to maximize common mode range at the input stage of an amplifier or other circuit and yet operate with the smallest expected supply voltages.

The invention addresses the foregoing problems by implementing a level shifter in a circuit as a floating voltage source whose value is dependent upon the supply voltages. The level shifter is designed, given a required input voltage $V_2$ to the next stage, so that a desired voltage, $V_1$, exists across the drive stage, which is usually a load device or circuit. The level shifter is incorporated in a first current leg between two supply voltages. A second reference current leg is connected in parallel to the first leg. The legs are coupled by means, such as a current mirror, for replicating the reference current in the first current leg. A floating voltage source $V_3$ is preferably designed to provide a desired $V_1$, given $V_2$ as described above, the potential $V_3$ being set in accordance with an additive function, e.g., $V_3 = V_1 + V_2 + V_{c1} - V_4$, substantially independent of the supply voltages. Operation of the level shifter can be chosen to be dependent upon device parameters and temperature in such a way that the voltage $V_1$ has a desired functional dependence, thereby compensating for variations in other circuit devices.

The level shifting circuit of the invention will work over a wide range of supply voltages. Drive stage voltage $V_1$ can be chosen no larger than necessary to maximize common mode voltage on the input and to operate with the smallest possible supply voltages. The circuit can be readily incorporated in bipolar, JFET, MOSFET or MESFET technologies. The circuit can be, and preferably is, implemented with high-speed NPN bipolar or GaAsFET transistors, making it suitable for use in wideband feedback amplifiers and operational amplifiers. The circuit structure can be varied within the scope of the invention to provide a large input impedance and to level shift a voltage or to have a low nput impedance and level shift a current. The circuit can be used in a differential configuration for substantial rejection of any power supply signal or noise coupled through the circuit, as it would represent a common mode signal.

The foregoing and other objects, features and advantages of the invention will become more readily apparent from the following detailed description which proceeds with reference to the drawings.

Figure 1:
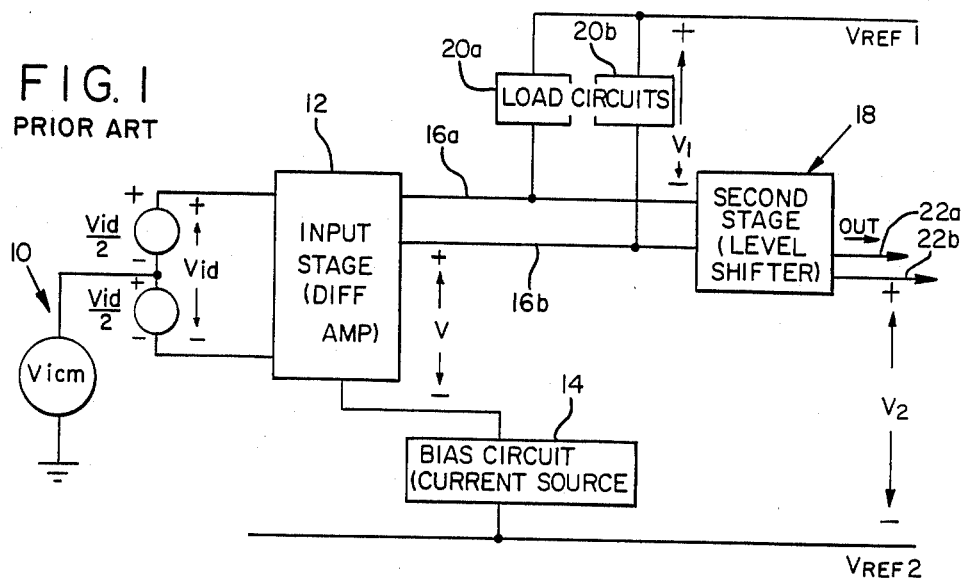
FIG. 1 is a simplified model of a differential amplifier incorporating a level shifter.

In the figures, both bipolar silicon and GaAsFET embodiments of the invention are shown. Like reference numerals and characters are used consistently throughout the drawings to identify subcircuits and elements of like function. As will be appreciated by those skilled in the art, however, the specific structure and parameters of the like-identified devices will differ from one embodiment to the next.

DETAILED DESCRIPTION

General Arrangement and Operation

Referring to FIG. 1, a common mode signal source 10 is shown added with differential input signal sources to an input stage, such as a differential amplifier 12. A bias circuit, such as a current source 14, is connected between the input stage and the supply voltage $V_{ref2}$. A bias potential V exists across the input stage. The input stage has differential outputs 16a, 16b, that are connected to inputs of a second stage, comprising a level shifter 18, and to load circuits 20a, 20b. The load circuits are, in turn, connected to another supply voltage $V_{ref1}$. The potential $V_1$ across the load circuits must be sufficient to insure proper operation. The second stage has differential outputs 22a, 22b.

Figure 3:
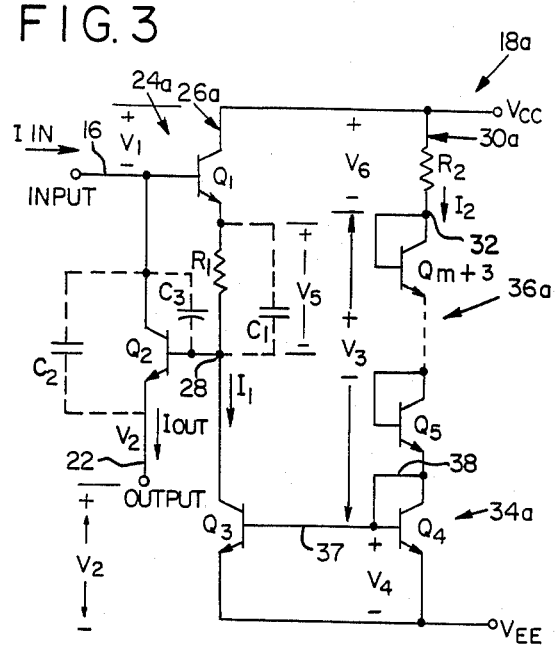
FIG. 3 is a schematic diagram of a bipolar integrated level shifting circuit in accordance with the invention.

The outputs of either or both the input stage and the level shifter may be single-ended, as shown in FIG. 3. The level shifter output is conventionally coupled to an input of a third stage, such as a common emitter or common source amplifier (not shown). When used in a differential configuration, the level shifter 18 preferably includes two identical single-ended level shifting circuits, as shown in further detail in FIG. 5.

Output 22 must be at a potential $V_2$ relative to supply voltage $V_{ref2}$, across the input of the third stage, which is sufficient to properly bias the third stage. The required potentials $V_1$ and $V_2$ are predetermined by the specific designs of the load circuits and third stage circuit. They are treated as predetermined for purposes of this invention, although the designer often has some latitude in designing these circuits to alter their voltage requirements.

An input signal is input to amplifier 12, amplified and output to the level shifter and load circuits. The level shifter shifts the quiescent DC voltage level of the amplified signal and relays the signal to the third stage (not shown). The level shifter thereby enables the amplifying devices to operate at the desired operating points. This describes the conventional usage of level shifters and is applicable to the usage of level shifters designed in accordance with the invention.

Figure 2:
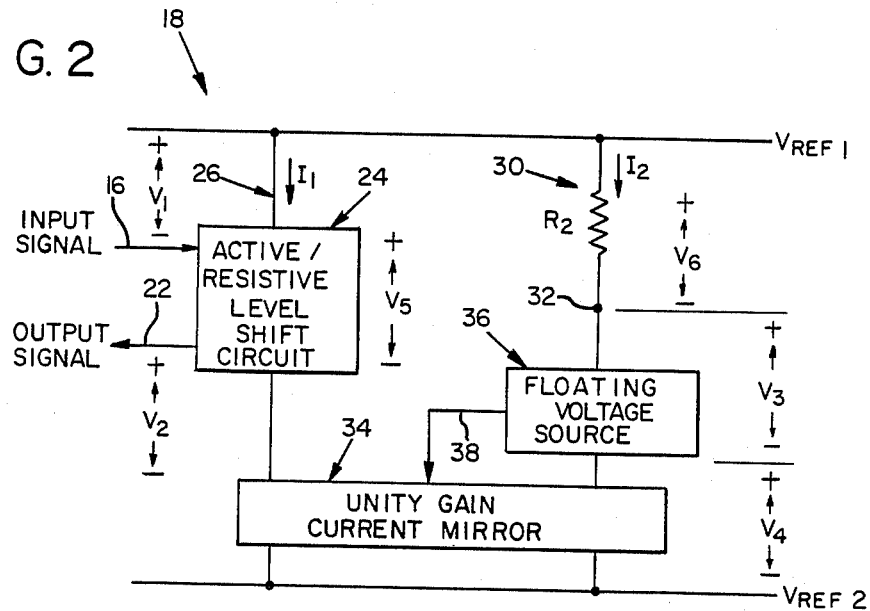
FIG. 2 is a block diagram illustrating the general principles of a level shifter in accordance with the invention.

Referring to FIG. 2, generally showing a level shifter 18 in accordance with the invention, the nomenclature of FIG. 1 is continued. This level shifter includes an active/resistive level shift circuit 24 having a single input 16 and a single output 22. (Alternatively, two such circuits can be used in c, as shown in FIG. 5, to provide level shifter 18 differential inputs and outputs.) Circuit 24 is coupled in a first current leg 26 between the two supply voltages $V_{ref1}$ and $V_{ref2}$ by a first conducting means, which can include a current source as next described, for conduction of a current $I_1$ between the two voltage supplies through the level shift circuit. As further discussed below, the level shift circuit includes a first resistor (resistor $R_1$ in FIGS. 3-7), coupled in series in the first current leg, to provide a voltage drop $V_5$. The current passes through a first intermediate voltage node (node 28 in FIGS. 3-7). Suitable output means connect this node to output 22.

A second current leg 30 is provided between the two supply voltages, in parallel with the first current leg. This current leg includes a resistor $R_2$ coupled through a second conducting means, which can also include a current source, for conduction of a second current $I_2$ through the resistor and a second intermediate voltage node 32. The second current produces a voltage drop $V_6$ between the first supply voltage $V_{ref1}$ and node 32 that varies with the difference between the supply voltages.

Both current legs are coupled by a means, such as a unity gain current mirror (or inverting current amplifier) 34, for establishing a predetermined relationship between the first and second currents through the first and second resistors such that variations in the second current, e.g. due to variations in the supply voltages, are replicated in the first current. The current mirror includes a coupling means 37 (FIGS. 3-7) coupling the first and second conducting means, which is biased by a floating voltage source 36 with a potential $V_3$ relative to the second intermediate voltage node 32. A control conductor 38 (FIGS. 3-7) couples current mirror 34 to intermediate node 32 in the second current leg, preferably through voltage source 36.

The first and second conducting means each include parallel voltage dropping means (shown in FIGS. 3-7) for providing a voltage drop $V_4$ between the conducting means 37 and the second supply voltage $V_{ref2}$. As discussed further below, such means can be provided by any suitable combination of diodes, resistors and—in appropriate circuits—the control voltage $V_c$ ($V_{be}$ or $V_{gs}$) of one or more transistors.

Pursuant to the basic principles of the invention, given predetermined values required for $V_1$ and $V_2$, the designer selects a value $V_3$ for the floating voltage source in accordance with an additive function, comprising the sum of $V_1$ and $V_2$, less $V_4$. This value is preferably selected to provide a potential $V_1$, that is independent of the supply voltages. Typically, the level shifter includes a first transistor Q1, as further described below, which contributes to this sum an additional $V_{be}$ or $V_{gs}$. If the level shifter includes a second transistor Q2, as appears in the preferred embodiments below, it adds another $V_{be}$ or $V_{gs}$ to the sum. The current mirror also conventionally includes transistors—a third transistor Q3 in the first current leg and a fourth transistor Q4 in the second current leg. If these transistors are different, they will establish proportional but different currents in each leg. Ideally, the values of currents $I_1$ and $I_2$ and resistors $R_1$ and $R_2$ are chosen to be equal, in which case $V_3 = V_1 + V_2 + V_c - V_4$, where $V_c$ represents the $V_{be}$ or $V_{gs}$ of transistor Q1 and, optionally, Q2.

Bipolar Silicon Level Shifters

Referring next to FIG. 3, in a bipolar level shifter 18a the level shift circuit 24a includes a first NPN bipolar transistor Q1 with input 16 coupled to its base. Its collector is connected to the first supply voltage $V_{CC}$ and its emitter to resistor $R_1$, which is coupled to intermediate node 28. A second NPN bipolar transistor Q2 has its base connected to node 28 and its emitter to output 22. Its collector is shown connected to input 16, i.e., to the base of the first transistor Q1. This provides a feedback amplifier having a low impedance shunt input for level shifting a current. As discussed below, the collector of transistor Q2 can alternatively be connected to either the collector or emitter of transistor Q1 to provide a high input impedance voltage level shifter. Capacitors C1, C2 and C3 can be used in level shift circuit 24a but are not essential. For high-speed operation, however, capacitors C1 and C3 are preferably used.

The level shift circuit 24a is coupled in the first current leg 26a to the second supply voltage $V_{EE}$ through the collector and emitter of transistor Q3, which serves as the first conducting means mentioned above. A transistor Q4 is similarly coupled in the second current leg 30a. The base of transistor Q3 is connected via conductor 37 to the base of transistor Q4. Control conductor 38, in turn, connects conductor 37 to the second current leg at the collector of transistor Q4. Thus connected, transistors Q3 and Q4 function as a current mirror to couple the two current legs together and cause the first current to track or replicate the second current. Preferably, transistors Q3 and Q4 are identical so that the currents $I_1 = I_2$. In this embodiment of the invention, the base-emitter voltages of bipolar transistors Q3 and Q4 provide the voltage drop $V_4$.

The second current leg 30a includes a voltage dropping means, i.e., floating voltage source 36a, typically a series of diode-connected transistors $Q^5$ through $Q_{m+3}$, connected in series with resistor R2. Although preferably located between the resistor and the collector of transistor $Q^4$, the diode-connected transistors can alternatively be connected elsewhere in current leg 30a, e.g., between the resistor and supply voltage $V_{CC}$, or between transistor $Q^4$ and supply voltage $V_{EE}$. With conductor 38 connected from collector-to-base on transistor $Q^4$, the diode-connected transistors serve to bias node 32 at potential $V_3$ from conductor 37.

Analyzing the circuit, it is apparent that $V_{CC} - V_{EE} = V_1 + V_2 + 2V_{be} + V_5$ for the first leg 26a, and $V_{CC} - V_{EE} = V_3 + V_4 + V_6$ for the second leg 30a, where $V_5 = I1R1$ and $V_6 = I2R2$.

Equating the two right half sides of the equations for $V_{CC} - V_{EE}$, and assuming that $I1 = I2$, if the resistor values are selected so that $R1 = R2$, then $$V_3 = V_1 + V_2 + 2V_{be} - V_4, \text{ where } V_4 = V_{be}.$$

In a typical circuit design, the load circuits and the input to the third stage each may include a transistor requiring at least one $V_{be}$ potential from their respective supply voltages to operate properly. In that case, it would be appropriate, as a minimum, to set $V_1 = V_{be}$ and $V_2 = V_{be}$, so that $V_3 = 3V_{be}$, indicating that the diode string Q5 through $Q_{m+3}$ requires a total of three diodes.

Figure 4:
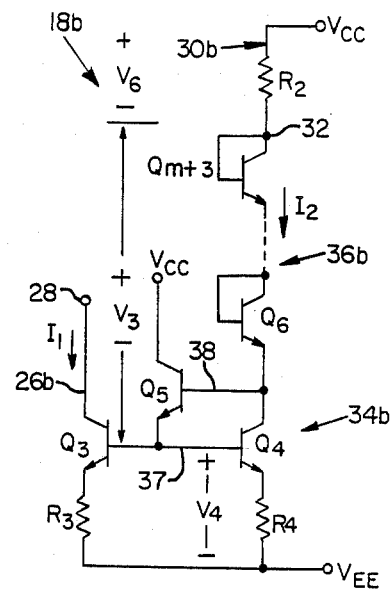
FIG. 4 is a schematic diagram of an alternative embodiment of the floating voltage source and the current mirror portions of the circuit of FIG. 3.
Figure 5:
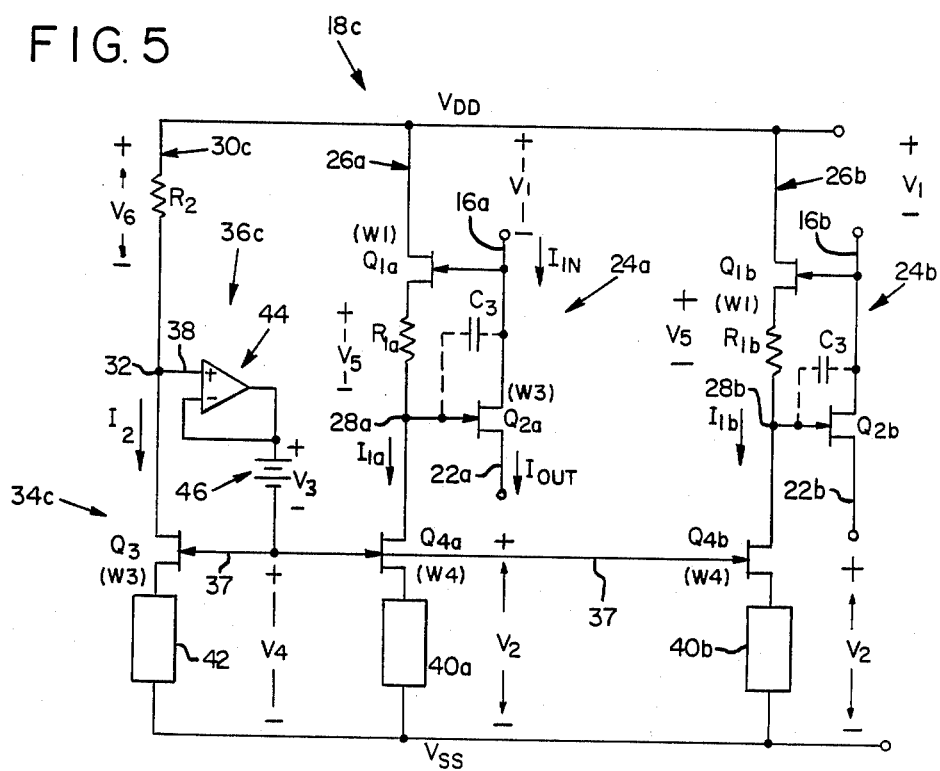
FIG. 5 is a simplified schematic diagram of a GaAsFET integrated level shifting circuit in accordance with the invention.

Referring to FIG. 4, an alternate biasing circuit is shown for creating current I1. In this Figure, level shift circuit 24a is omitted for convenience, but is assumed to be the same as that of FIG. 3. In this embodiment, two additional resistors R3 and R4 are optionally connected between the second supply voltage, $V_{EE}$, and the emitters of transistors Q3 and Q4, respectively. A transistor Q5 is connected as an emitter-follower buffer, with its base and emitter providing control conductor 38, and its collector connected to the first supply voltage $V_{CC}$. The string of diode-connected transistors is re-identified as $Q^6$ through $Q_{m+3}$.

The analysis of the circuit is similar to that of the previous circuit. The current mirror establishes $I1 = cI2$, where c is a proportionality constant, if $R4 = cR3$ and the emitter areas of transistors Q3 and Q4 are related by $A3 = cA4$. (As those skilled in the art will understand, R3 must also satisfy the bias requirements of transistor Q3 to avoid operating in the saturation region.) It can then be shown that $$V_1 = (V_{CC} - V_{EE})[1 - cR1/(R2+R4)] + \\ V_{be}cR1/(R2+R4) - 2V_{be} + V_3cR1/(R2+R4) - V_2$$

If the circuit values are selected so that $cR1/(R2+R4) = 1$, then it follows that
$V_1 = V_3 - V_2 - V_{be}$.

As mentioned above, $V_2$ is constrained by the next tage and a desired $V_1$ is selected by the designer. If $V_1 = V_{be}$ and $V_2 = V_{be}$, then $V_3 = 3V_{be}$, which calls for three transistors, i.e., two diode-connected transistors and an emitter-follower transistor Q5.

GaAsFET Level Shifters

Referring to FIG. 5, a level shifter 18c is implemented in GasAsFET technology. This figure shows a differential implementation of the invention. Although this figure is rearranged relative to FIGS. 3 and 4, the structural similarity is apparent. Instead of a single, first current leg, the differential implementation uses two first current legs 26a, 26b having, respectively, differential inputs 16a, 16b with a potential $V_1$ relative to the first supply voltage $V_{DD}$ and differential outputs 22a, 22b at a potential $V_2$ relative to the second supply voltage $V_{SS}$.

The components in each of these current legs are identified with the same reference numerals and letters used in FIGS. 3 and 4, supplemented by the subscripts a-b to correspond to the particular leg in which they are used. Thus, instead of a single transistor Q1 and resistor R1, current leg 26a includes a transistor $Q_{1a}$ and resistor R1a while current leg 26b includes a transistor $Q_{1b}$ and resistor $R_{1b}$. Likewise, instead of single transistors Q2 and Q4, each of the differential current legs includes a transistor $Q_{2a}$, $Q_{4a}$, and transistor $Q_{2b}$, $Q_{4b}$, respectively. The currents in these two legs are identified as $I_{1a}$ and $I_{1b}$, respectively.

Since transistors $Q_{4a}$ and $Q_{4b}$ are depletion-mode FET devices, a voltage dropping means 40a, 40b is usually required in each current leg between supply voltage $V_{SS}$ and the sources of transistors $Q_{4a}$ and $Q_{4b}$, respectively. A similar voltage dropping means 42 is connected in the source of transistor Q3. These voltage dropping means preferably take the form of a string of diodes but can include resistive elements as an alternative or in combination with diodes to provide the proper bias in the source of transistors Q3, $Q_{4a}$ and $Q_{4b}$.

Referring to the second current leg, 30c, a resistor R2 is provided as in the circuits discussed above, and connected to the drain of transistor Q3. Connected between intermediate voltage node 32 and conductor 37, to provide a floating voltage source 36c in series with resistor R2, are a buffer amplifier 44 and a voltage source 46, which provides potential $V_3$. The buffer amplifier 44 is an ideal device, having substantially no voltage drop between node 32 and voltage source 46. Voltage source 46 thus defines substantially the entire voltage drop between node 32 and conductor 37. Conductor 37 interconnects the gates of current mirror transistors Q3, $Q_{4a}$, $Q_{4b}$. Parenthetically beneath the identification of each of the current mirror transistors is an indication of the gate width of each transistor. Transistor Q3 has a gate width W3 and transistors $Q_{4a}$ and $Q_{4b}$ each have a gate width of W4. The gate widths of transistors $Q_{4a}$ and $Q_{4b}$ will ordinarily be selected to be equal, as will the values of resistors $R_{1a}$, $R_{1b}$ and voltage dropping means 40a, 40b and the gate widths of transistors $Q_{1a}$ and $Q_{1b}$, so that currents $I_{1a}$ and $I_{1b}$ are equal. For simplicity, it is also preferable to have the gate widths of all of the transistors equal.

Figure 7:
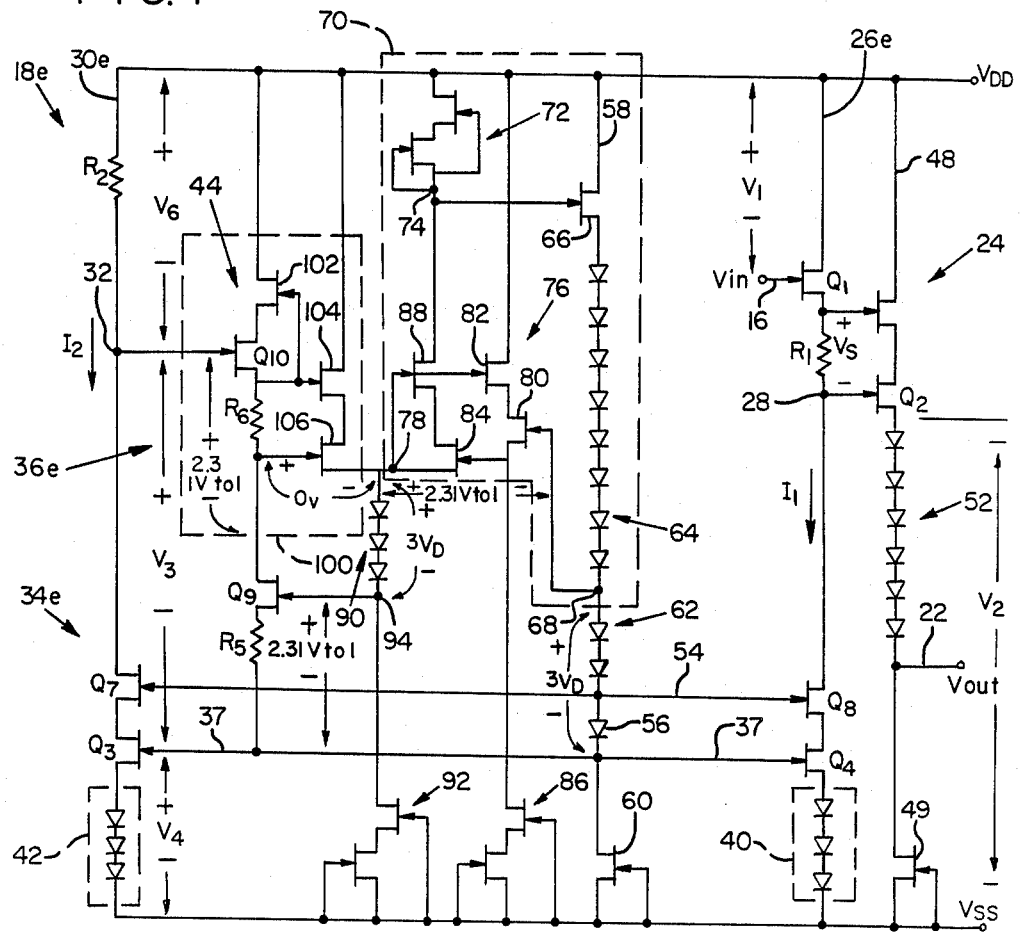
FIG. 7 is a more detailed schematic diagram of an example of one possible implementation of the circuit of FIG. 6.

More detailed examples of buffer amplifier 44 and voltage source 46 are shown in FIG. 7.

The analysis of the circuit shown in FIG. 5 is essentially the same as that of the foregoing figures. If the second current legs 26a and 26b are substantially identical, the analysis is equally applicable to both.

Transistors $Q_{1a}$, $Q_{1b}$ and $Q_{2a}$, $Q_{2b}$ form a feedback amplifier in the same manner as Q1 and Q2 of the bipolar embodiment. The amplifier also acts as a second, additional floating voltage source whose value is I1 $R2+V_{gs1}+V_{gs2}$. The current gain of this circuit is nearly unity. It is, therefore, suitable for level shifting a current from one stage to another stage. Transistors Q3, $Q_{4a}$ and $Q_{4b}$ form a current mirror with current $I2=(VDD-VSS-V_3-V4)/R1$. If transistor widths W3=W4 and R1=R2, then V5=V6=VDD-VSS-V3-V4. V2 is constrained by the circuit connected to output nodes 22a, 22b and $V_1$ is a desired bias voltage which allows the load circuit connected to nodes 16a, 16b to operate properly with power supply, temperature and process variations, but as small as possible to maximize parameters such as common mode range and dynamic range. Potential V3 of voltage source 46 is chosen in conjunction with the FET gate widths and potential V4 to produce the desired potential $V_1$ given potential $V_2$. It can be shown that potential $V_3 = V_1 + V_2 + V_{gs1} + V_{gs2} - V4$. Potential $V_3$ is preferably defined in terms of the pinch-off voltage of the GaAsFETs and sometimes in terms of diode voltages.

Operation of this circuit is substantially immune to noise and aberrations in the supply voltages, and undesired temperature and process variations. By defining the form of the voltage source for potential V3 in terms of potentials $V_1$ and $V_2$, with the latter potentials defined by the circuits to which the level shifter interfaces, temperature and process variations in these circuits can be compensated for in operation of the level shifting circuit of the invention.

In the differential configuration shown in FIG. 5, if power supply abberations or noise are coupled through the circuit, such signals will be substantially rejected since they constitute a common mode signal.

Figure 6:
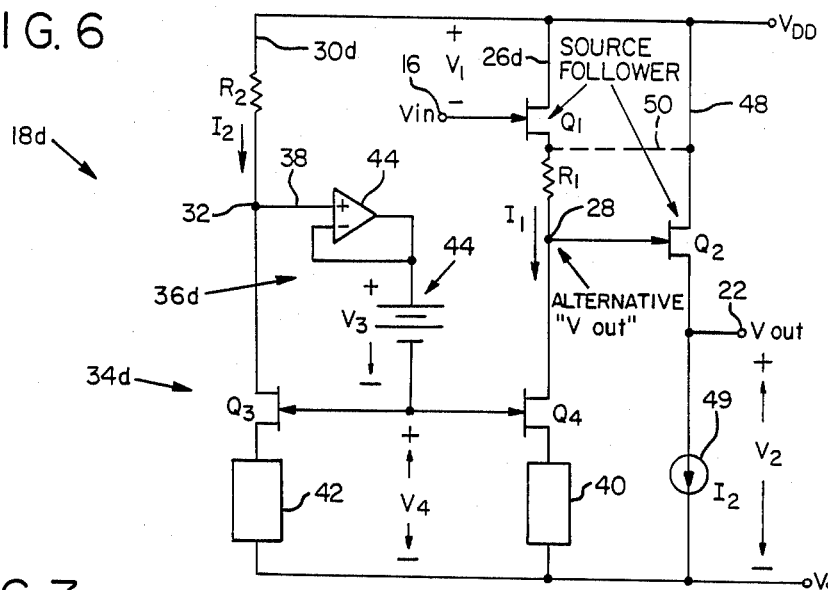
FIG. 6 is a schematic diagram of an alternate embodiment of the circuit of FIG. 5, providing a high impedance input for level shifting a voltage level.

FIG. 6 shows an alternate embodiment of the circuit of FIG. 5. For simplicity, FIG. 6 shows a ingle-ended level shifter. The components and arrangement of this circuit are essentially the same as those FIG. 5, so only the differences are discussed. In this embodiment, the drain of transistor Q2 is not connected to input 16, but to supply voltage VDD. Alternatively, the drain of transistor Q2 can be returned to the source of transistor Q1, as indicated by dashed line 50. This circuit can still be used to produce the desired potential $V_1$ given potential $V_2$. In this embodiment the level shifter has a high input impedance and a low output impedance, thus level shifting a voltage rather than a current, with an amplifier(s) with approximately unity voltage gain. In many situations this may be the preferred embodiment.

It is also possible for the output voltage to be taken directly from node 28. In this variation, transistor Q2 could be omitted altogether and node 28 connected directly to output node 22.

FIG. 7 shows a more detailed realization of the circuits of FIGS. 5 and 6. As much as possible, the same identifications are used in this figure as in the prior figures. This is supplemented by an indication of actual values employed in an operative example of the circuit, where the load circuit requires a potential $V_1 = 3\ V_{TO}$] and the input to the next stage requires potential $V_2 = 1.6\ [V_{TO}]$. $V_{TO}$ is a parameter relating to the pinchoff voltage of a GaAsFET device and includes process and temperature dependencies of the device.

Referring to the right side of FIG. 7, the level shift circuit 24 and current leg 26e are structured substantially as described above. The principal differences are that the output signal, from the source of transistor Q2, is dropped through a string of six diodes 52 before passing to the output node 22. Current source 49 is provided by a GasFET having its source connected to its gate at potential $V_{SS}$. In current leg 26e, the voltage dropping means 40 is provided by a string of three diodes in the source of transistor Q4. In addition to transistor Q4, another transistor Q8 is connected in the drain of transistor Q4.

Referring to the second current leg 30e on the left side of FIG. 7, voltage dropping means 42 is likewise provided by a string of three diodes and a transistor Q7 is connected in the drain of transistor Q3. Transistors Q7 and Q8 are used, with transistors Q3 and Q4, respectively, to form a cascode current mirror. This enhances the accuracy of the current mirror in replicating current I1 from current I2. The gates of transistors Q7 and Q8 are interconnected by a conductor 54. This conductor is, in turn, connected through a diode 56 to control conductor 37 in a biasing current leg 58. This current leg extends between supply voltages VDD and VSS and includes a current source-connected GaAsFET 60 connected at its gate and source to supply voltage VSS. This current leg also includes a string 62 of two diodes and a string 64 of eight diodes connected in series with a source follower buffer transistor 66 connected in series to supply voltage VDD. This subcircuit serves as a level shifter for biasing the transistors connected to the diode strings at conductors 37, 54 and 68. All of the transistors in this circuit are biased to operate in the saturation or high gain region.

A portion of this circuit, indicated in dashed lines, forms a reference voltage source 70. This subcircuit includes a current source 72 provided by two transistors connected in series to VDD and having their gates coupled to the source 74 of the second transistor from VDD. The source is also coupled to the gate of source follower buffer 66. The reference voltage is provided by a subcircuit 76 which provides a defined voltage drop, in this example, of 2.3 [$V_{TO}$] between node 68 and node 78. Node 68 is connected to this circuit at the gate of a first transistor 80, which has its drain coupled to supply voltage VDD through a transistor 82 and has its source connected to the gate of a third transistor 84. The source of transistor 80 is also coupled to a current source 86, in the same form as current source 72, having the gates of the two transistors coupled to supply voltage VSS. Transistor 84 has its drain coupled through a transistor 88 to the source 74 of current source 72. The source of transistor 84 is connected to node 78 and to the gates of transistors 88 and 82. Transistors 82, 88 cascode transistors 80, 84, respectively. This arrangement provides a negative feedback loop around transistors 80, 84 and 66 which provides a stable 2.3 [$V_{TO}$] voltage drop from the gate of transistor 80 to node 78.

A string of three diodes 90 is connected between node 78 and a current source 92, like source 86, connected to supply voltage VSS. This string of diodes effectively nullifies the voltage drop across diodes 56, 62 so that the voltage drop from node 68 to node 78 also appears between node 94 and conductor 37. Node 94 is connected to a gate of a transistor Q9, which has its source coupled to conductor 37 through a resistor R5. The potential across this transistor and resistor provides a portion of the potential V3 that is needed to operate level shifter 18e in accordance with the invention so as to meet the requirements specified above for potentials V1 and V2.

An additional portion of potential V3 is provided by a potential replicating circuit 100. This subcircuit includes a transistor Q10 having its gate coupled to node 32 in current leg 30e. The drain of ransistor Q10 is coupled through a cascode transistor 102 to supply voltage VDD. The source of transistor Q10 is connected to the gate of transistor 102. This pair of transistors also serves as a high impedance buffer amplifier 44. The source of transistor Q10 is coupled to the drain of transistor Q9 through a second resistor $R_6$.

A pair of transistors 104, 106 is connected in series between supply voltage VDD and node 78. The gate of transistor 104 is connected to the source of transistor Q10. The gate of transistor 106 is connected to the drain of transistor Q9, so that the gates of transistors 104 and 106 are separated by the potential across resistor R6. These two transistors form a buffer amplifier having zero voltage drop between the gate and source of transistor 106.

The current flowing through transistor Q9 and resistor R5 is the same as that flowing through transistor Q10 and resistor R6. By making transistors Q9 and Q10 identical and setting the values of resistors R5 and R6 equal, transistors Q10 and resistor R6 provide a voltage drop from node 32 to the drain of transistor Q9 which is identical to the voltage drop from the gate of transistor Q9 to conductor 37. The total potential from node 32 to conductor 37 is thus 4.6 [$V_{TO}$]+3VD, when VD is the voltage drop across a diode. This is the potential V3 that was determined above as being necessary to meet the requirements for potentials V1 and V2.

Having illustrated and described the principles of my invention in a preferred embodiment and alternatives thereof, it should be readily apparent to those skilled in the art that the invention can be modified in arrangement and detail without departing from such principles.

I claim all modifications coming within the spirit and scope of the accompanying claims.

1. A high speed level shifting circuit, comprising:
    level shifting means including a first transistor having a control electrode defining a signal input and first and second controlled electrodes, the first controlled electrode connected to a first reference voltage to define a first voltage potential $V_1$ between the signal input and the first reference voltage, and the second controlled electrode connected to a first resistor;
    first conducting means coupling the first transistor and first resistor in series to a second reference voltage for conducting a first current through the first resistor and a first intermediate voltage node at a potential between the first and second reference voltages;
    a second resistor and second conducting means for conducting a second current through the second resistor and coupling the second resistor between the second reference voltage and a second intermediate voltage node at a potential between the first and second reference voltages in parallel with the first current;
    output means for coupling the first intermediate voltage node to a signal output having a second voltage potential $V_2$ with respect to the second reference voltage; and
    replicating means for establishing a predetermined relationship between the first and second currents through the first and second resistors such that variations in the second current due to variations in either or both of the reference voltages are replicated in the first current, said means including a coupling means for coupling said first and second conducting means; and
    biasing means defining a floating reference voltage potential $V_3$ in series with the second resistor;
    the first and second conducting means each including parallel voltage dropping means for providing a voltage drop $V_4$ between the coupling means and the second reference voltage;
    the values of the first and second resistors and the reference voltage potential $V_3$ being set in accordance with an additive function comprising the sum of $V_1$, $V_2$ and $V_{C1}$, less $V_4$, where $V_{C1}$ is the difference of the voltage at the control electrode and the voltage at the second controlled electrode.

2. A high-speed level shifting circuit according to claim 1 in which the values of potential $V_3$, the first and second resistors, the first and second conducting means, and the replicating means are such that $V_1$ is substantially independent of the first and second reference voltages.

3. A high-speed level shifting circuit according to claim 1 in which the coupling means includes a control conductor controllably coupling said replicating means to the second intermediate voltage node.

4. A high-speed level shifting circuit according to claim 1 in which the floating reference voltage potential is coupled between the second intermediate voltage node and the coupling means.

5. A high-speed level shifting circuit according to claim 1 in which the replicating means and the first and second conducting means form a current mirror including:
a second transistor having first and second controlled electrodes connected in series with the first resistor and the controlled electrodes of the first transistor to define said first conducting means;
a third transistor having first and second controlled electrodes connected in series with the second resistor to define the second conducting means; and
a control conductor means controllably coupling the coupling means to the second intermediate voltage node;
the second and third transistors each having control electrodes interconnected by the coupling means so that any variations in voltage at the second intermediate voltage node due to variations in either of both of the first and second reference voltages are transmitted to the control electrodes of the second and third transistors to proportionally control the first and second currents and thereby cause variations of the second current to be replicated in the first current to compensate for said reference voltage variations.

6. A high-speed level shifter according to claim 5 in which
the current mirror is arranged such that the first current is equal to the product of a proportionality constant c times the second current;
the voltage dropping means for providing voltage drop $V_4$ includes third and fourth resistors coupled in series with the second and third transistors, respectively, and having values R3 and R4, respectively, such that R4=cR3; and
the first and second resistors have values R1 and R2, respectively, proportioned such that $cR1/(R2+R4)=1$, whereby operation of the level shifting circuit is substantially independent of said variations in the first and second reference voltages.

7. A high-speed level shifting circuit according to claim 5 in which the control conductor means includes a buffer having an input connected to the second intermediate voltage node and an output coupled to the coupling means in series through the means defining the floating reference voltage potential $V_3$.

8. A high-speed level shifting circuit according to claim 5 in which the second and third transistors have equal gate widths and the first and second resistors have equal values so that the first and second currents are equal, voltage potential $V_3$ being determined by the function $V_3 = V_1 + V_2 + V_{C1} - V_4$, independently of said gate widths and resistor values.

9. A high-speed level shifting circuit according to claim 5 in which the transistors are bipolar NPN transistors and the voltage dropping means providing voltage drop $V_4$ includes at least the base-emitter voltage $V_{be}$ of the second and third transistors.

10. A high-speed level shifting circuit according to claim 9 in which the voltage dropping means includes a resistor connected between the second reference voltage and the emitter of each of the second and third transistors.

11. A high-speed level shifting circuit according to claim 5 in which the transistors are field effect transistors and the voltage dropping means providing the voltage drop $V_4$ includes a diode connected between the second reference voltage and the source of each of the second and third transistors.

12. A high-speed level shifting circuit according to claim 1 in which the level shifting means comprises a feedback current amplifier with approximately unity gain, including a second transistor having a control electrode connected to the first intermediate voltage node, a first controlled electrode connected to one of the electrodes of the first transistor, and a second controlled electrode connected to the signal output to define said output means, said additive function including a gate-source or base-emitter voltage drop $V_{C2}$ across the second transistor.

13. A high-speed level shifting circuit according to claim 12 in which the second transistor has its first controlled electrode connected to the control electrode of the first transistor to provide a shunt input to the amplifier for level shifting a current.

14. A high-speed level shifting circuit according to claim 12 in which the second transistor has its first controlled electrode connected to one of the controlled electrodes of the first transistor to provide a high impedance input to the amplifier for level shifting a voltage.

15. A high-speed level shifting circuit according to claim 1 in which said means defining floating voltage potential $V_3$ comprises a buffered floating voltage source having an input connected to the second intermediate voltage node and an output connected to the second conductor means.

16. A high-speed level shifting circuit according to claim 15 in which said floating voltage source includes a voltage follower buffer in series with a voltage dropping subcircuit including at least one of a resistor and a diode and having a voltage drop equal to $V_3$.

* * * * *